United States Patent

[11] 3,609,464

[72] Inventor Dennis Stone
Edmonton, London, England
[21] Appl. No. 862,420
[22] Filed Sept. 30, 1969
[45] Patented Sept. 28, 1971
[73] Assignee International Standard Electric Corporation
New York, N.Y.
[32] Priority Oct. 2, 1968
[33] Great Britain
[31] 46706/68

[54] CHASSIS FOR MOUNTING PRINTED CIRCUIT BOARDS
8 Claims, 4 Drawing Figs.

[52] U.S. Cl. .......................................................317/101DH, 317/101 CC
[51] Int. Cl. ....................................................... H02b 1/02
[50] Field of Search ........................................... 317/101 DH, 101, 101 C, 101 CB; 174/68.5; 339/17 C, 17 LM, 17 M, 17 LC

[56] References Cited

UNITED STATES PATENTS 2,411,528 11/1946 Dodington .................... 317/101 CB

*Primary Examiner*—David Smith, Jr.
*Attorneys*—C. Cornell Remsen, Jr., Walter J. Baum, Percy P. Lantzy, J. Warren Whitesel, Delbert P. Warner and James B. Raden

ABSTRACT: A chassis is provided for printed circuit boards. This chassis includes a framework in two sections which when connected provide a means for mounting the boards in a closely packed manner. The framework is easily separated by taking out removable fasteners to provide access to the boards for servicing.

PATENTED SEP 28 1971 3,609,464

SHEET 1 OF 3

*Inventor*

Dennis Stone

By James B. Raden

*Attorney*

CHASSIS FOR MOUNTING PRINTED CIRCUIT BOARDS

This invention relates to structure of the kind for mounting electrical equipment, and particularly to a chassis construction incorporating printed circuit boards.

The construction of electrical equipment in the form of a case containing a chassis on which printed circuit boards are mounted s now very common. This form of construction lends itself to a high components density as with small or essentially planar components the boards can be close together. However, the closeness of the boards can make servicing difficult. The most common solution to this problem is to provide the boards with plugs which engage sockets permanently mounted in the chassis. The boards can be fitted in guides for mechanical stability. Servicing is by removing a board and replacing it with a known working one or by use of extension boards or cables to separate the suspected faulty board from the chassis while still in operation. This technique has the following disadvantages. Firstly the plugs and sockets, even when expensive "professional"types are used, are liable to faulty contact under vibration, as is often met in vehicles. Secondly the cost of maintaining extension boards or cables is high as often a different one is required for each board position.

According to the invention there is provided a chassis for electrical equipment of the printed circuit board type in which the chassis is a framework in two sections which are connected mechanically to form a rigid structure, in which each section supports one or more of the printed circuit boards by support means, in which each supporting means provides a permanent mounting for a printed circuit board of the respective section and a disengageable mounting for a printed wire board of the other section, in which said mounting means are so positioned on each section that the boards of each section, when the sections are connected, have a permanent mounting on a support means of their own section and a disengageable mounting on a support means of the other section, and in which the permanent and disengageable mountings are positioned on the support means so that the boards, when the chassis sections are connected, are closely packed.

The support means may be plastic mouldings to which one board is bolted while a tightly fitting groove is provided for the other board.

According to a subordinate feature of the present invention the chassis sections each correspond to a discrete electrical section of the equipment, the printed boards comprising each electrical section are wired together on the respective chassis section and the chassis sections when mechanically disconnected, remain electrically connected so that all surfaces of the boards can be examined while in operation.

Embodiments of the invention will now be described with reference to the accompanying drawings in which.

Figure 1:
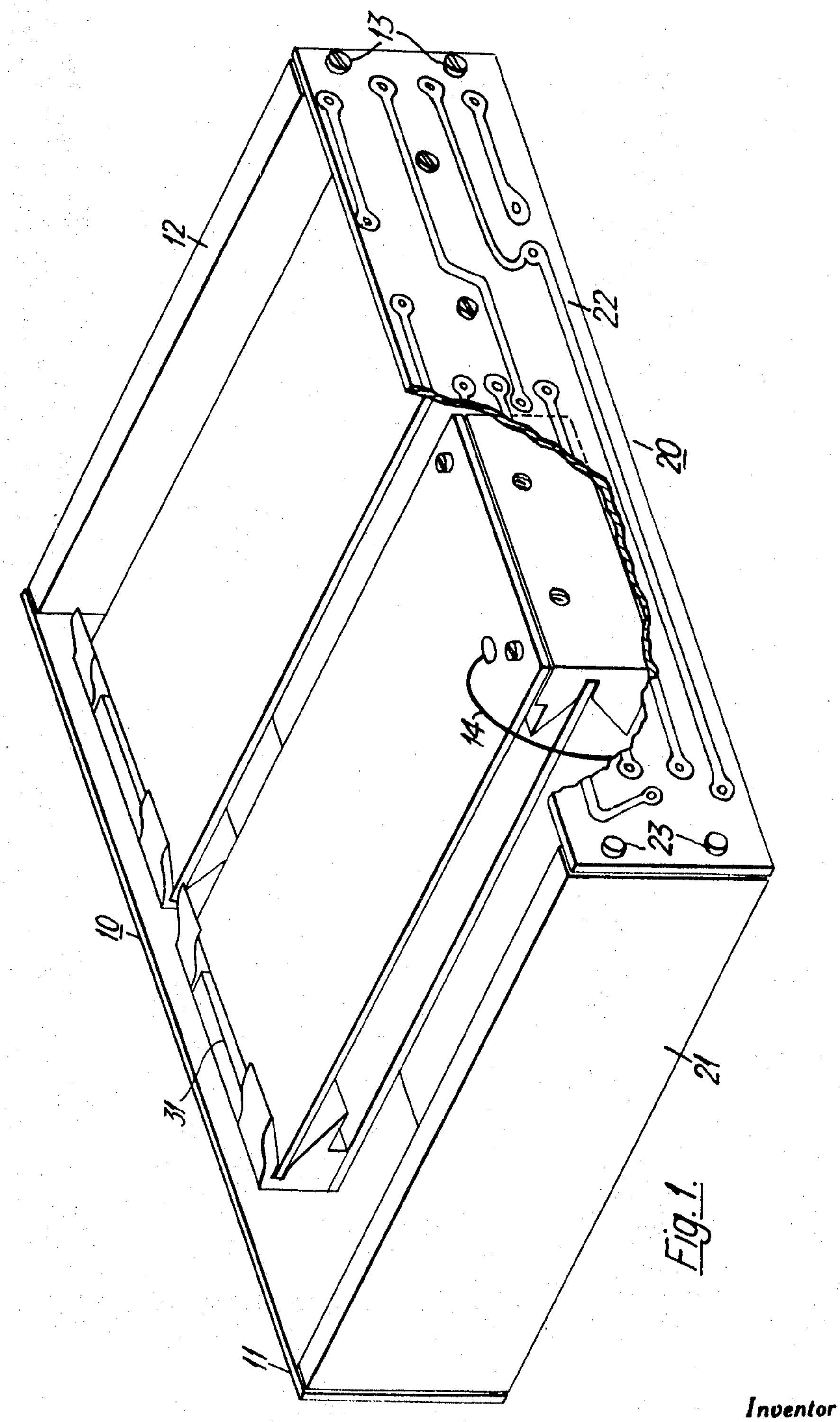
FIG. 1 is a view of a portion of a chassis embodying the invention.

Referring to FIG. 1 each chassis section 10, 20 is formed from a printed circuit panel, 11, 22 respectively and a metal panel 12, 22 respectively. A metal panel and a printed circuit panel are joined together at one end to form each of two L-shaped chassis sections. This joint is permanent in that the fastenings, 23, for example, are tamper resistant. The other L-shaped sections are joined together at their free ends by easily removed fastenings, 13, for example, to form a rigid framework.

Figure 2:
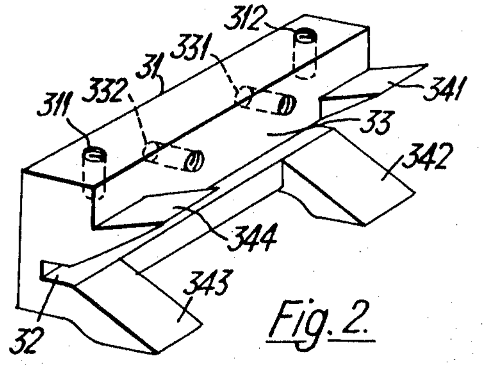
FIG. 2 shows a board support means.

Referring to FIG. 2 the support member is a plastics moulding with bearing surface 31 and a groove 32.

The bearing surface has two tapped holes 311, 312 which may be made by moulding inserts 311, 312 into the plastics material so that a printed board can be screwed onto the bearing surface 31. The body 33 of the support member between the groove and the bearing surface has two holes, either formed with tapped inserts, or as clearance holes, 331, 332 so that the support member can be attached to printed circuit panel 11 or 22. The groove 32 is an interference fit on the printed wire board and resilient guides 341, 342, 343, 344 ensure that the board enters the groove when the chassis sections bearing boards are assembled together. The rear faces of guides 341 and 344 are rebated so that they are clear of the bearing surface 31 to prevent interference with component leads or tracks on a board attached thereto.

The plastics material is selected so that the groove is sufficiently resilient to allow the board to enter and be retained under vibration while not being rigidly clamped. This reduces the risk of board fracture.

Referring to FIG. 1, the tracks on printed wire panels 11 and 22 are shown connected to their respective boards by short leads such as 14. The relative positions of the support means on opposite chassis sections are also shown.

Figure 3:
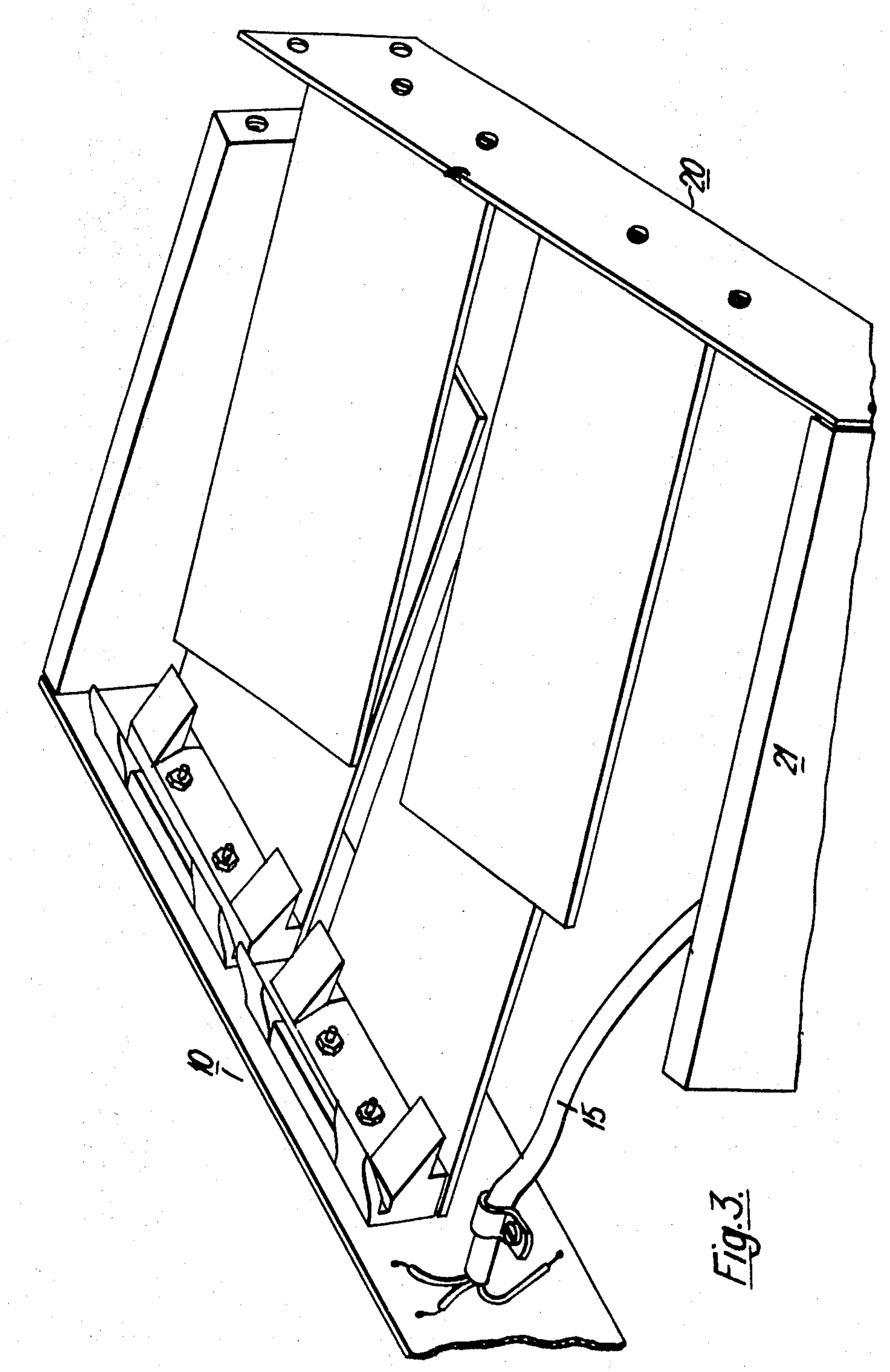
FIG. 3 shows the chassis of FIG. 1, when mechanically disconnected.

Referring now to FIG. 3 the effect of mechanically disconnecting the chassis section is shown. The boards remain electrically connected to the respective printed circuit panel while any controls on the front panel, which may be metal panel 21, remain connected through cable 15. The chassis therefore remains in a functioning state while all surfaces of the boards are accessible for test. If replacement of a board is indicated the chassis section with the faulty board can be disconnected and replaced with a known sound section.

Figure 4:
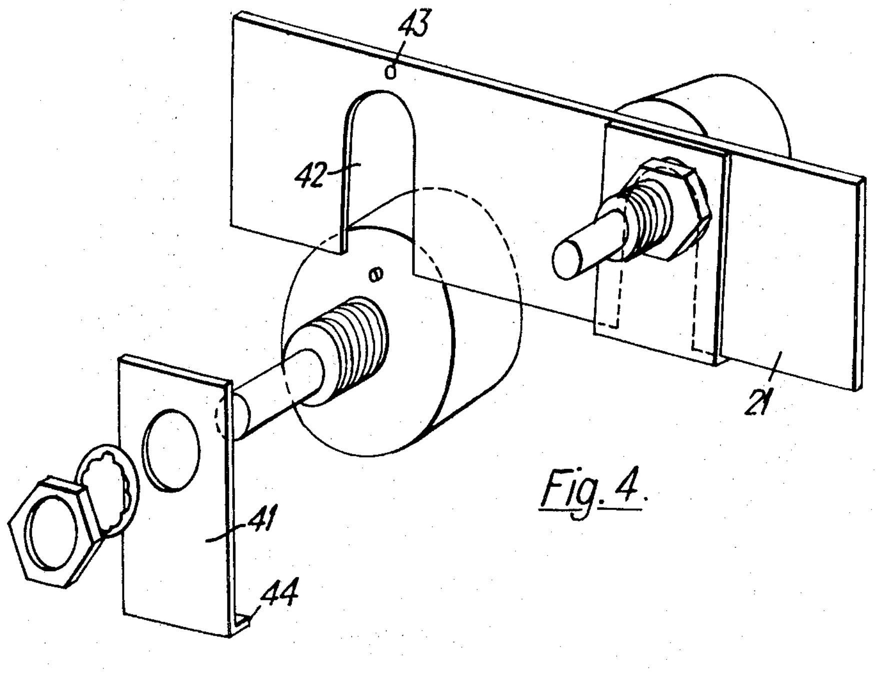
FIG. 4 shows the control mounting region of a chassis embodying the invention, partly dismantled.

FIG. 4 shows a method of mounting controls on the front panel 21. Controls are usually mounted by passing the spindle and bush through a hole in a panel and tightening a nut on the bush against the panel. This requires considerable access space behind the panel particularly when controls with long spindles are used. When plug-in boards are used sufficient boards can be unplugged to provide the access space so that the controls can be removed for replacement. However when wired-in boards are used the access space must be left clear and is wasted. To avoid this waste the mounting holes for the spindles are slotted so that the bush on the control will slide into the slot in the panel. A plate is placed on the single bush followed by the nut before the control is mounted in the panel. A control can then be slid into the slot in the panel without taking up any more space than when it is mounted in place on the panel. This arrangement is shown in FIG. 4, the plate 41 being wider than the slot 42 in the front panel 21. In this way the plate 41 seals the slot in the front panel to prevent the ingress of dust and similar debris into the interior of the equipment. A lip 44 engages with the lower edge of panel 22 to locate the plate and prevent movement when installed. A locating hole 43 can be placed in the front panel to provide a mounting for the locating stud normally found on rotary controls. It will be seen that whereas with the normal method of mounting a rotary control the control must be withdrawn into the equipment nearly for the length of its spindle, by using this mounting method there is no need for any more rearward axial movement than is necessary to clear the locating stud from the front panel. This provides a more compact chassis arrangement than has hitherto been possible.

A preferred embodiment of this form of chassis construction has been employed on a transceiver designed for mounting on a dashboard of a vehicle particularly a motor car. It is essential that equipment of this type be quickly serviced when a fault occurs as while the equipment is out of action the vehicle and its driver are also prevented from operating normally. The chassis construction when combined with the case construction described in our copending application, Dennis Stone—2, provides a piece of electrical equipment structure which is very quickly dismantled by a serviceman to enable tests and repairs to be made. It has been found that the rotary controls on this type of equipment, particularly the volume control, are the ones most susceptible to wear. The method of mounting described above enables such controls to be rapidly replaced without dismantling a major part of the equipment. The printed circuit panels, the rear metal panel and the front metal panel in conjunction with the filler plates 41 provide a complete wall around the equipment which, when augmented by a top and bottom cover, effectively prevents the ingress of dust and cigarette ash which are particular hazards of equipment mounted under vehicle dashboards.

I claim:

1. A chassis for electrical equipment of the printed circuit board type in which the chassis is a framework comprising two sections connected mechanically to form a rigid structure, each section including means supporting one or more printed circuit boards, each supporting means including first mounting means to which printed circuit boards are held by a fastener and second mounting means to which printed circuit boards have a friction fit, said mounting means occupying positions on each of said two sections to provide to each board a permanent mounting on the respective first mounting means of a first one of said sections and a disengageable mounting on a respective second mounting means of the other section, said first and second mounting means being positioned relative to the support means so that the boards, when the chassis sections are connected, are closely packed.

2. An electrical equipment chassis as claimed in claim 1 in which the first mounting means of the support means is a bearing surface on said support means against which a printed circuit board can be held by fastening means engaging with said bearing surface, and in which the second mounting means of said support means is a groove in said support means in which a printed circuit board is an interference fit.

3. An electrical equipment chassis as claimed in claim 2 in which the support means is molded from a plastics material.

4. An electrical equipment chassis as claimed in claim 2 in which the disengageable mounting has associated guide surfaces to direct a printed circuit board into the groove.

5. An electrical equipment chassis as claimed in claim 1 in which each chassis section is L-shaped, the limbs of which comprise a metal panel and a printed circuit panel joined by tamper-resistant fastenings, in which said support means are mounted on the printed circuit panel in which the sections when mechanically connected form a rectangular structure with the printed circuit panels opposite each other.

6. An electrical equipment chassis as claimed in claim 5 in which one metal panel is a control mounting panel, in which there is a slot for each control mounting bush, and in which a filler plate on each bush overlaps the slot and is clamped against the panel between the bush and a clamping nut on the bush to mount the control, whereby said control can be mounted on or removed from the panel by only loosening the clamping nut on the bush.

7. An electrical equipment chassis as claimed in claim 1, in which the chassis sections each correspond to a discrete electrical section of the equipment in which the printed boards comprising each electrical section are wired together on the respective chassis section and in which the chassis sections, when mechanically disconnected, remain electrically connected so that all surfaces of the boards can be examined while in operation.

8. An electrical equipment chassis as claimed in claim 1 in which the support means is a plastics body with a bearing surface in which there are tapped holes inserts so that a printed circuit board can be permanently mounted on the bearing surface, in which the body has tapped holes inserts therethrough for fastening means to attach it to said chassis, in which the body has a resilient groove to accommodate the edge of a printed circuit board, which groove is an interference fit on said edge, and in which there are guide surfaces adjacent said groove to guide said edge toward said groove.